United States Patent [19]

Hattori

[11] Patent Number: 5,170,368
[45] Date of Patent: Dec. 8, 1992

[54] DIGITAL DECIMATION FILTER

[75] Inventor: Shinji Hattori, Higashi-Osaka, Japan

[73] Assignee: Sharp Kabushiki Kaisha, Osaka, Japan

[21] Appl. No.: 707,883

[22] Filed: Jun. 3, 1991

[30] Foreign Application Priority Data

Jun. 8, 1990 [JP] Japan .................................. 2-150530

[51] Int. Cl.$^5$ ............................................. G06F 15/31
[52] U.S. Cl. .................................................. 364/724.1
[58] Field of Search ........................................ 364/724.1

[56] References Cited

U.S. PATENT DOCUMENTS

| 4,819,252 | 4/1989 | Christopher | 364/724.1 |
| 4,972,360 | 11/1990 | Cukier et al. | 364/724.1 |
| 5,018,090 | 5/1991 | Shiratsuchi | 364/724.1 |
| 5,051,981 | 9/1991 | Kline | 364/724.1 |

Primary Examiner—David H. Malzahn
Attorney, Agent, or Firm—Nixon & Vanderhye

[57] ABSTRACT

A digital decimation filter including: a shift register array having N shift registers connected to each other is series for storing an input data at every input sampling interval, a switch circuit for selecting signals from output signals respectively outputted from the N shift registers, a conversion circuit for linearly converting a signal being inputted to the shift register array and the signals selected by the switch circuit into a single signal, and an accumulative addition circuit for integrating the single signal repeatedly a predetermined number of times. The switch circuit selects M signals $S_n, S_{2n}, \ldots, S_{Mn}$ from the output signals $S_1, S_2, \ldots, S_n$ of the N shift registers when a decimation ratio indicative of a ratio of an input sampling frequency to an output sampling frequency is n, where N, M and n are integers satisfying an inequality $N \geq M \times n$.

6 Claims, 2 Drawing Sheets

DIGITAL DECIMATION FILTER

BACKGROUND OF THE INVENTION

1. Field of the Invention

The present invention relates to a digital decimation filter used for a device such as an over sampling A/D converter.

2. Description of the Related Art

In general, a digital decimation filter is three-dimensional moving average filter having a transfer function expressed by the following equation. A decimation ratio n which indicates a ratio of an input sampling frequency to an output sampling frequency i a fixed integer;

$$H(Z) = \{(1 - Z^{-n})/(1 - Z^{-1})\}3 \tag{1}$$

where Z is a complex number.

In such a digital decimation filter, the decimation ratio n is utilized to simultaneously control input and output sampling clocks, and the decimation ratio n is a fixed integer.

The above conventional digital decimation filter has a problem in that it is not possible to arbitrarily change the decimation ratio because the value of n is fixed.

SUMMARY OF THE INVENTION

The object of the present invention is therefore to provide a digital decimation filter capable of changing the decimation ratio.

The object of the invention can be achieved by a digital decimation filter comprising:

a shift register array comprising N shift registers connected to each other is series for storing an input data at every input sampling interval;

a switch circuit for selecting signals from output signals respectively outputted from said N shift registers;

a conversion circuit for linearly converting a signal being inputted to said shift register array and said signals selected by said switch circuit into a single signal; and an accumulative addition circuit for integrating said single signal repeatedly a predetermined number of times;

wherein said switch circuit selects M signals $S_n$, $S_{2n}$, ..., $S_{Mn}$ from said output signals $S_1$, $S_2$, ..., $S_N$ of said N shift registers when a decimation ratio indicative of a ratio of an input sampling frequency to an output sampling frequency is n, where N, M and n are integers satisfying an inequality $N \geq M \times n$.

The digital decimation filter according to this invention is constructed in such a manner that when the decimation ratio indicating the ratio of an input sampling frequency to an output sampling frequency is n, the switch circuit selects M signals $S_n$, $S_{2n}$, ..., $S_{Mn}$ from said output signals $S_1$, $S_2$, ..., $S_N$ of the shift registers (where N, M and n are integers satisfying an inequality $N \geq M \times n$). It is therefore possible to arbitrarily change the decimation ratio and to adjust an output sampling position.

Further object and advantages of the present invention will be apparent from the following description, reference being had to the accompanying drawings wherein a preferred embodiment of the present invention is clearly shown.

DESCRIPTION OF THE PREFERRED EMBODIMENT

Figure 1:
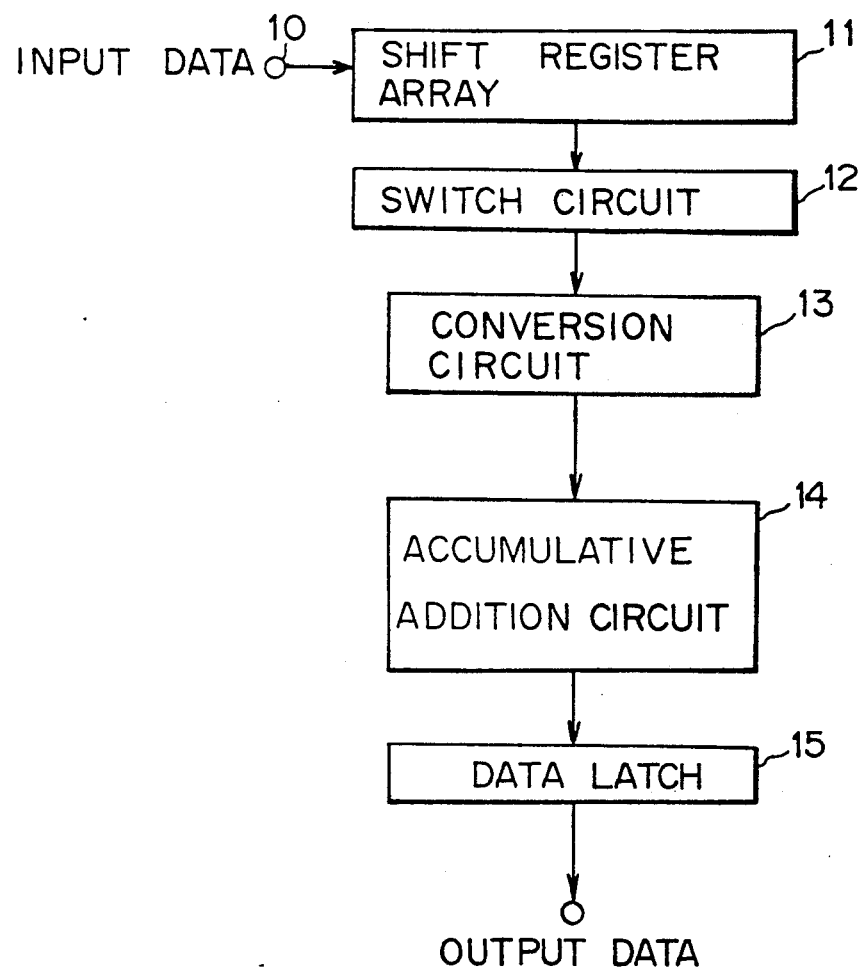
FIG. 1 is a block diagram of an embodiment of a digital decimation filter in accordance with the present invention.

FIG. 1 is a block diagram of an embodiment of the present invention.

In FIG. 1, a shift register array 11 is composed of a plurality of shift registers connected to each other in series. The output of each shift register is connected to a switch circuit 12. A conversion circuit 13 is connected to an output of the switch circuit 12. The conversion circuit 13 supplies an accumulative addition circuit 14 with a signal which have been formed by linearly converting signals selected by the switching circuit 12. The accumulative addition circuit 14 integrates three times the signal supplied from the conversion circuit 13 and outputs it through a data latch 15.

Figure 2:
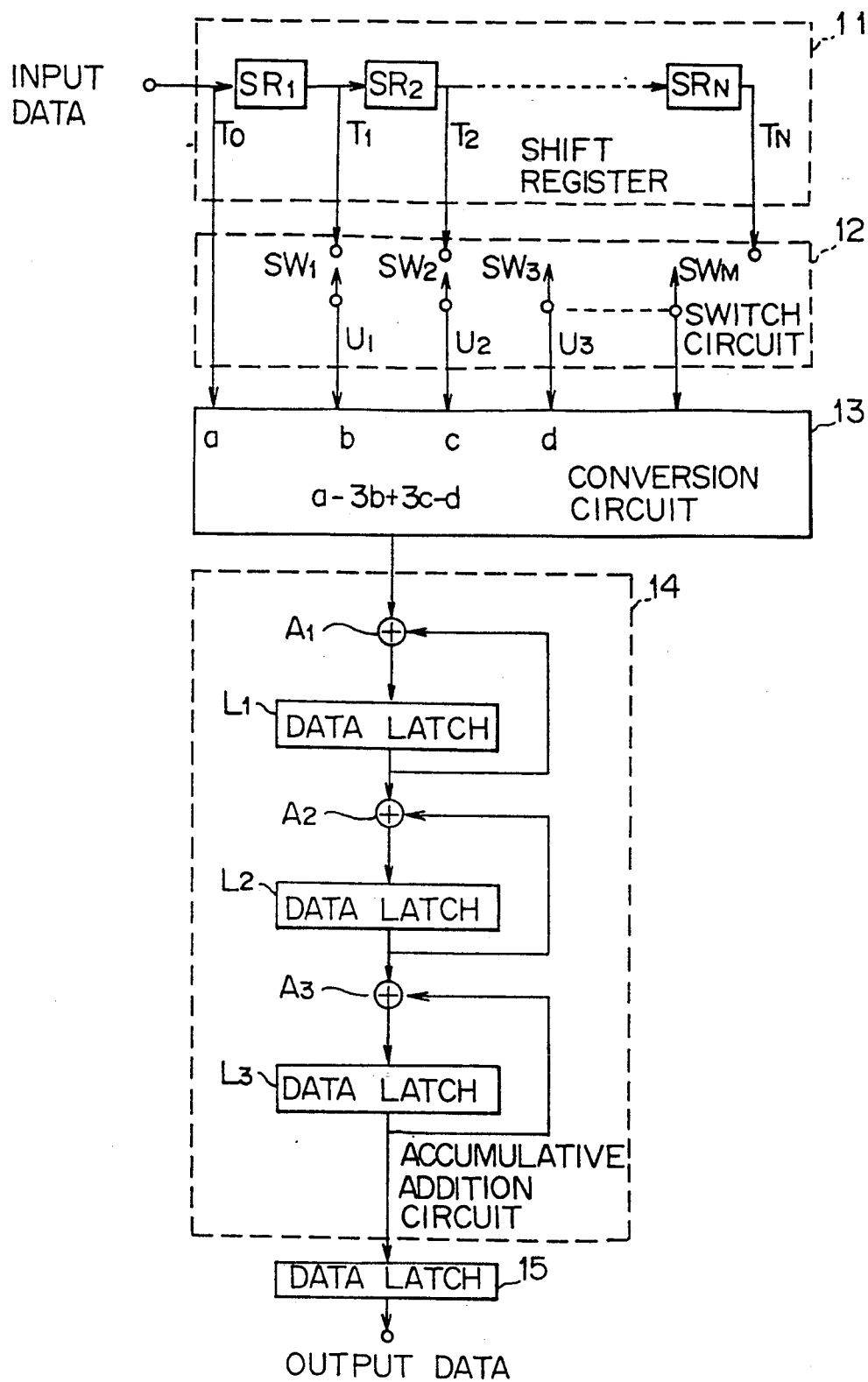
FIG. 2 is a block diagram showing the structure in detail of the digital decimation filter of FIG. 1.

As shown in FIG. 2, the shift register array 11 includes N shift registers $SR_1$, $SR_2$ ... $SR_N$ connected to each other in series to store respectively 1-bit of input data which has been pulse-width-modulated. As shown in Table 1, the initial value of each shift register $SR_1$, $SR_2$ ... $SR_N$ is preset in such a manner that the value of each odd-numbered shift registers is "0" (or "1") and the value of each even-numbered shift registers is "1" (or "0").

TABLE 1

| Shift registers | Odd bits ($SR_1$, $SR_3$ ...) | 0 | 1 |
|---|---|---|---|
| | Even Bits ($SR_2$, $SR_4$ ...) | 1 | 0 |

As illustrated in FIG. 2, in order to change the decimation ratio n indicating the ratio of an input sampling frequency to an output sampling frequency, the switch circuit 12 directly outputs the signal from an output terminal $T_0$ connected directly to an input terminal of the shift register $SR_1$, and selects M output signals from signals outputted from output terminals $T_1$, $T_2$, ... $T_N$ of the shift registers $SR_1$, $SR_2$, ... $SR_N$ by means of switches $SW_1$, $SW_2$, ... $SW_m$.

When the decimation ratio n is set, an inequality $N \geq M \times n$ must be satisfied.

In this embodiment where the decimation filter has three switches $SW_1$, $SW_2$, $SW_3$, to select three output signals, the switch $SW_1$ selects an output terminal $T_n$ outputting a signal b to the conversion circuit 13 through an output terminal $U_1$; the switch $SW_2$ selects an output terminal $T_{2n}$ outputting a signal c to the conversion circuit 13 through an output terminal $U_2$; and the switch $SW_3$ selects an output terminal $T_{3n}$ outputting a signal d to the conversion circuit 13 through an output terminal $U_3$.

As depicted in FIG. 2, the conversion circuit 13 performs a linear conversion according to the following equation:

$$a - 3b + 3c - d \tag{2}$$

This equation is based on a signal a transmitted from the output terminal $T_0$ directly connected to the input terminal of the shift register $SR_1$, and the signals b, c and d sent from the output terminals $U_1$, $U_2$ and $U_3$, respectively.

As shown in FIG. 2, the accumulative addition circuit 14 has adders $A_1$, $A_2$ and $A_3$ to integrate the output signal of the converting circuit 13 three times. The adder $A_1$ adds the signal outputted from the conversion circuit 13 to a signal previously delivered and latched by a data latch $L_1$; the adder $A_2$ adds the signal latched by the data latch $L_1$ to a signal previously delivered and latched by a data latch $L_2$; and the adder $A_3$ adds the signal latched by the data latch $L_2$ to a signal previously delivered and latched by a data latch $L_3$. As shown in Table 2, the initial values of the respective data Latches $L_1$, $L_2$ and $L_3$ are set in accordance with the decimation ratio and the initial values of the respective shift registers $SR_1$, $SR_2$, ... $SR_N$.

TABLE 2

| | | Decimation ratio | |
|---|---|---|---|
| | | Odd number | Even number |
| Shift registers 11 | Odd bits ($SR_1$, $SR_3$ ...) | 0    1 | 0    1 |
| | Even bits ($SR_2$, $SR_4$ ...) | 1    0 | 1    0 |
| Accumulative addition circuit 14 | Data latch $L_1$ | −2    2 | 0    0 |
| | Data latch $L_2$ | 1    −1 | 0    0 |
| | Data latch $L_3$ | 0    0 | 0    0 |
| Data latch 15 | | 0    0 | 0    0 |

As shown in Table 2, the initial value of the data latch 15 is always set at "0" regardless of the decimation ratio and the initial values of the respective shift registers $SR_1$, $SR_2$, ... $SR_N$. The data latch 15 outputs data latched by the data latch $L_3$ of the accumulative addition circuit 14 at every output sampling interval.

The operation of this embodiment will be described.

As illustrated in FIGS. 1 and 2, each shift register $SR_1$, $SR_2$, ... $SR_N$ outputs data stored therein. The signal from the output terminal $T_0$ connected directly to the input terminal of the shift register SR is directly outputted. The switches $SW_1$, $SW_2$, and $SW_3$ select three output signals from the signals outputted from the shift registers $SR_1$, $SR_2$, ... $SR_N$ in accordance with the decimation ratio. The conversion circuit 13 linearly converts the signals a, b, c and d into a single signal. The signal a is sent from the output terminal $T_0$, directly connected to the input terminal of the shift register $SR_1$, the signals b, c and d being transmitted from the output terminals $U_1$, $U_2$ and $U_3$ of the switches $SW_1$, $SW_2$, and $SW_3$, respectively. The accumulative addition circuit 14 integrates the output signal from the conversion circuit 13 three times.

Because the switching circuit 12 selects three input signals, the decimation ratio n can be changed. The accumulative addition circuit 14 outputs a signal as a function expressed by the equation (1).

The data latch 15 latches data latched by the data latch $L_3$ of the accumulative addition circuit 14 at every output sampling interval and outputs it at every output sampling interval which has a minimum unit equivalent to the input sampling interval.

Many widely different embodiments of the present invention may be constructed without departing from the spirit and scope of the present invention. It should be understood that the present invention is not limited to the specific embodiment described in this specification, except as defined in the appended claim..

What is claimed is:

1. A digital decimation filter comprising:
   a shift register array comprising N shift registers connected to each other in series for storing an input data at every input sampling interval;
   a switch circuit for selecting signals from output signals respectively outputted from said N shift registers;
   a conversion circuit for linearly converting a signal being inputted to said shift register array and said signals selected by said switch circuit into a single signal; and
   an accumulative addition circuit for integrating said single signal repeatedly;
   wherein said switch circuit selects three signals $S_n$, $S_{2n}$, $S_{3n}$ from said output signals $S_1$, $S_2$, ..., $S_N$ of said N shift registers when a decimation ratio indicative of a ratio of an input sampling frequency to an output sampling frequency is n, satisfying an inequality $N \geq 3 \times n$, and when said signal being inputted to said shift register array is regarded as a, and said three signals $S_n$, $S_{2n}$, and $S_{3n}$ are regarded as b, c and d, respectively, said conversion circuit calculates a value of $a - 3b + 3c - d$, and supplies said value to said accumulative addition circuit.

2. A digital decimation filter comprising:
   a shift register array comprising N shift registers connected to each other in series for storing an input data at every input sampling interval;
   a switch circuit for selecting signals from output signals respectively outputted from said N shift registers;
   a conversion circuit for linearly converting a signal being inputted to said shift register array and said signals selected by said switch circuit into a single signal; and
   an accumulative addition circuit for integrating said single signal repeatedly;
   wherein said switch circuit selects M (M is an integer equal to or greater than three) signals from said output signals $S_1$, $S_2$, ..., $S_N$ of said N shift registers when a decimation ratio indicative of a ratio of an input sampling frequency to an output sampling frequency is n, where N, M and n are integers satisfying an inequality $N \geq M \times n$.

3. A digital decimation filter according to claim 2, wherein said switch circuit selects M signals $S_n$, $S_{2n}$, ..., $S_{Mn}$ from said output signals $S_1$, $S_2$, ..., $S_n$ of said N shift registers.

4. A digital decimation filter according to claim 3, wherein said switch circuit selects three signals $S_n S_{2n}$, and $S_{3n}$, and said conversion circuit linearly converts a signal being inputted to said shift register array and said three signals into a single signal.

5. A digital decimation filter according to claim 4, wherein when said signal being inputted to said shift register array is regarded as a, and said three signals are regarded as b, c, and d respectively, said conversion circuit calculates a value of $p\,a + q\,b + r\,c + s\,d$ (p, q, r, s are integers) and supplies said value to said accumulative addition circuit.

6. A digital decimation filter according to claim 5, wherein p equals to one, q equals to minus three, r equals to three, and s equals to minus one.

* * * * *